(12) United States Patent
Hess (10) Patent No.: US 7,566,882 B1
(45) Date of Patent: Jul. 28, 2009

(54) REFLECTION LITHOGRAPHY USING ROTATING PLATTER

(75) Inventor: Harald F. Hess, La Jolla, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 463 days.

(21) Appl. No.: 11/638,869

(22) Filed: Dec. 14, 2006

(51) Int. Cl.
*G01K 1/08* (2006.01)
*H01J 3/14* (2006.01)
*H01J 3/26* (2006.01)

(52) U.S. Cl. ............. 250/400; 250/492.24; 250/492.22; 250/492.23; 250/396 R; 250/398; 250/491.1; 250/492.2; 250/492.21; 430/4; 430/5; 430/30; 430/296

(58) Field of Classification Search ............ 250/492.24, 250/492.22, 492.23, 396 R, 398, 491.1, 492.1, 250/492.21, 400; 430/4, 5, 30, 296
See application file for complete search history.

(56) References Cited

U.S. PATENT DOCUMENTS

| 5,254,417 | A | * | 10/1993 | Wada ........................ 430/5 |
| 5,434,424 | A | | 7/1995 | Stickel et al. |
| 6,177,218 | B1 | | 1/2001 | Felker et al. |
| 6,207,965 | B1 | | 3/2001 | Koike |
| 6,235,450 | B1 | | 5/2001 | Nakasuji |
| 6,291,119 | B2 | | 9/2001 | Choi et al. |
| 6,333,508 | B1 | | 12/2001 | Katsap et al. |
| 6,414,313 | B1 | | 7/2002 | Gordon et al. |
| 6,429,443 | B1 | | 8/2002 | Mankos et al. |
| 6,511,048 | B1 | | 1/2003 | Sohda et al. |
| 6,525,328 | B1 | | 2/2003 | Miyoshi et al. |
| 6,573,516 | B2 | | 6/2003 | Kawakami |
| 6,586,733 | B1 | | 7/2003 | Veneklasen et al. |
| 6,605,811 | B2 | | 8/2003 | Hotta et al. |
| 6,610,890 | B1 | | 8/2003 | Garcia de Quesada Fort et al. |
| 6,657,211 | B2 | | 12/2003 | Benner |
| 6,674,086 | B2 | | 1/2004 | Kamada |
| 6,768,125 | B2 | * | 7/2004 | Platzgummer et al. . 250/492.22 |
| 6,870,172 | B1 | * | 3/2005 | Mankos et al. ......... 250/492.22 |
| 7,358,512 | B1 | * | 4/2008 | Lordi .................... 250/492.24 |

\* cited by examiner

*Primary Examiner*—David A Vanore
*Assistant Examiner*—Meenakshi S Sahu
(74) *Attorney, Agent, or Firm*—Okamoto & Benedicto LLP (57) ABSTRACT

One embodiment pertains to a method of electron beam lithography. An illumination electron beam is formed, and a dynamic pattern generating device is used to generate an electron-reflective pattern of pixels and to reflect the illumination electron beam from said pattern so as to form a patterned electron beam. The patterned electron beam is projected onto a platter configured to hold and rotate a plurality of target substrates. Said generated pattern of pixels is shifted in correspondence with the rotation of the platter so that the patterned electron beam writes a swath path of pixels over the target substrates. Other features, aspects and embodiments are also disclosed.

28 Claims, 9 Drawing Sheets

N=6
Util=0.750

**N=6
Util=0.750**

FIG. 6

**N=5
Util=0.735**

REFLECTION LITHOGRAPHY USING ROTATING PLATTER

GOVERNMENT LICENSE RIGHTS

The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency.

CROSS-REFERENCE TO RELATED APPLICATIONS

The present application is related to 10/851,040, now U.S. Pat. No. 6,870,172, entitled "Maskless reflection electron beam projection lithography," filed May 21, 2004 by Marian Mankos, Harald F. Hess, David L. Adler, and Kirk J. Bertsche, the disclosure of which is hereby incorporated by reference. The present application is also related to 10/851,041, entitled "Reflective electron patterning device and method of using same," filed May 21, 2004 by Harald F. Hess, Marian Mankos, and David L. Adler, the disclosure of which is hereby incorporated by reference.

BACKGROUND

1. Technical Field

The present application relates generally to semiconductor manufacturing and related technologies. More particularly, the present application relates to reflection lithography.

2. Description of the Background Art

Electron Beam Lithography

A lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

SUMMARY

One embodiment pertains to a method of reflection lithography. An illumination beam is formed, and a dynamic pattern generating device is used to generate a reflective pattern of pixels and to reflect the illumination beam from said pattern so as to form a patterned beam. The patterned beam is projected onto a platter configured to hold and rotate a plurality of target substrates. Said generated pattern of pixels is shifted in correspondence with the rotation of the platter so that the patterned beam writes a swath path of pixels over the target substrates.

DETAILED DESCRIPTION

Electron Beam Direct Write Lithography

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current and/or density exceeds a certain threshold, electron-electron interactions cause the beam to blur.

This patent application relates to a system and method of electron beam lithography that overcomes the above-discussed disadvantages and problems. Rather than focusing the electron beam into a small spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system cannot be not built using conventional integrated circuits technology because such integrated circuits are opaque to electrons.

Reflection Electron Beam Lithography

The apparatus and method disclosed herein re-directs the beam out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The apparatus and method disclosed herein advantageously breaks through the traditional EBDW speed-versus-resolution tradeoff by illuminating a large area and simultaneously exposing a multitude of pixels on the wafer. For example, four million pixels may be exposed using a 4000× 1000 array of individually addressable elements. This may be achieved using a single column and a conventional electron source.

Figure 1:
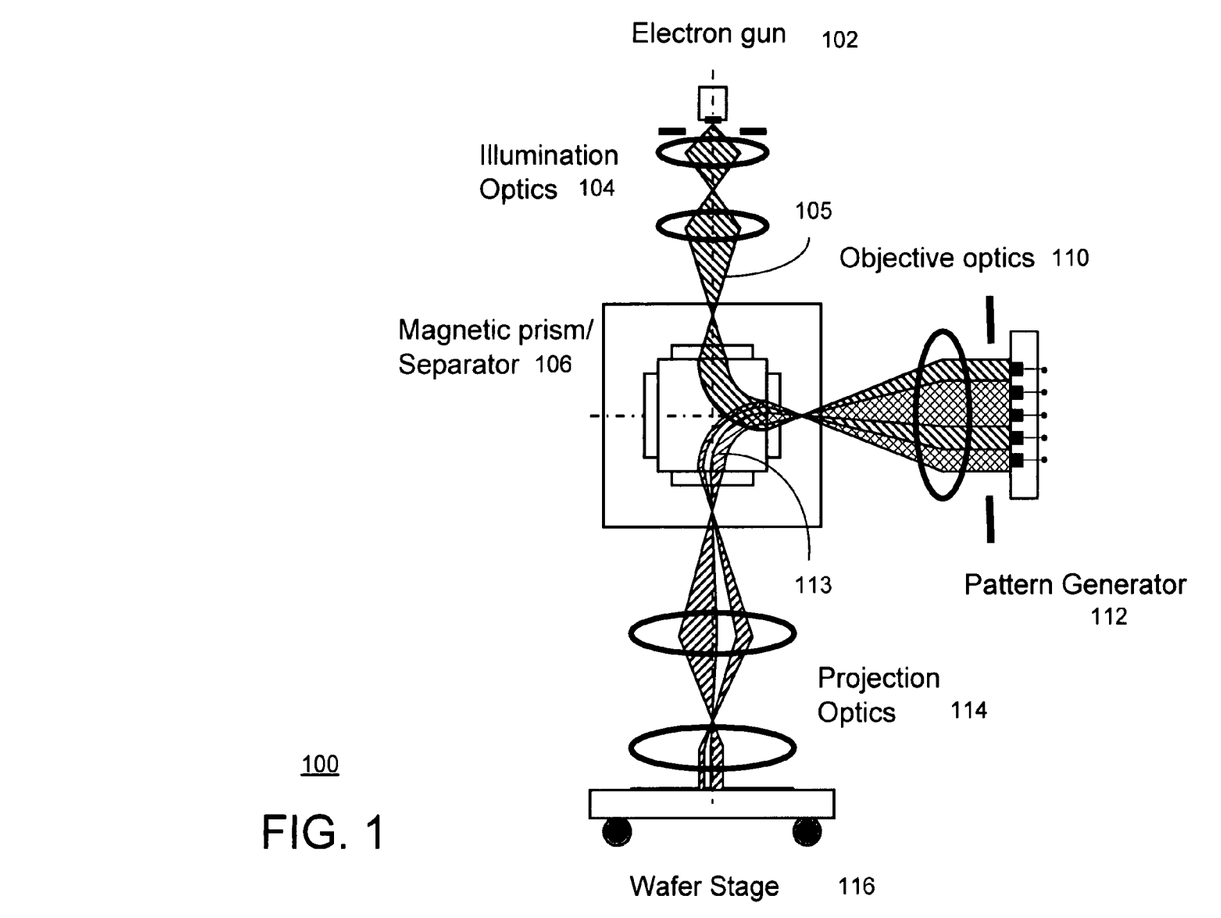
FIG. 1 is a schematic diagram of a maskless reflection electron beam projection lithography apparatus in accordance with an embodiment of the invention.

FIG. 1 is a schematic diagram of a maskless reflection electron beam projection lithography apparatus 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a dynamic pattern generator (DPG) 112, projection electron-optics 114, and a wafer stage 116 for holding a wafer or other targets to be lithographically patterned. In accordance with an embodiment of the invention, the various components of the apparatus 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm$^2$ sr (Amperes per cm$^2$ steradian) at 50 keV. One implementation uses LaB$_6$, a conventional electron emitter, which typically have a brightness capability of about $10^6$ A/cm$^2$ sr at 50 keV, as the source material. Another implementation uses tungsten dispenser emitters, which typically have a brightness capability of about $10^5$ A/cm$^2$ sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL apparatus 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have an energy spread no greater than 0.5 electron volts (eV). LaB$_6$ emitters have typical energy spreads of 1 to 2 eV, and tungsten dispenser emitters have typical energy spreads of 0.2-0.5 eV. In accordance with one embodiment of the invention, the source 102 comprises a LaB$_6$ source or tungsten Schottky emitter that is operated a few hundred degrees C. below its normal operating temperature to reduce the energy spread of the emitted electrons. However, cooler operating temperatures can destabilize the source 102, for example, due to impurities settling on the source surface and thereby diminishing its reliability and stability. Therefore, the source material may be preferably selected to be a material in which impurities are unlikely to migrate to the surface and choke off emission. Moreover, the vacuum on the system may be made better to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 102.

The illumination electron-optics (illumination optics, for brevity) 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the dynamic pattern generator 112. In a preferred embodiment, the magnetic prism 106 is configured with a non-uniform magnetic field so as to provide stigmatic focusing, for example, as disclosed in U.S. patent application Ser. No. 10/775,646, entitled "Improved Prism Array for Electron Beam Inspection and Defect Review," filed Feb. 10, 2004 by inventor Marian Mankos, the disclosure of which is hereby incorporated by reference. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics (projection optics) 114 reside between the prism 106 and the wafer stage 116. The projection optics 114 is configured to focus the electron beam and demagnify the beam onto photoresist on a wafer or onto another target. The demagnification may range, for example, from 1× to 100× demagnification (i.e. 1× to 0.01× magnification). A preferred operating range is between 20× and 50× demagnification. The blur and distortion due to the projection optics 114 is preferably a fraction of the pixel size. In one implementation, the pixel size may be, for example, 22.5 nanometers (nm). In such a case, the projection optics 114 preferably has aberrations and distortions on the order of a few tens of nm.

Problems and Solution with Respect to the Wafer Stage

The wafer stage 116 may comprise a conventional stage which may be controllably translated in a linear fashion along x and y dimensions. However, such a conventional xy stage may be problematic to implement for at least a couple of reasons.

First, higher stage translation speeds are enabled by the reflection electron beam lithography technique and by sparse written patterns that are often used in lithography for semiconductor manufacturing. Such sparse written patterns may be, for example, for contact layers or via layers that typically have less than 10% of the surface exposed. A traditional xy stage may be required to move at several meters per second to keep up with this faster writing capability. Such a high speed would be problematic to implement.

Second, acceleration-deceleration requirements and turnaround time constraints make the use of a conventional xy stage impractical. The speed and turnaround requirements combined may require a wafer stage to move back-and-forth, for example, over a fraction of a meter at roughly 10 hertz. This would exceed the acceleration-deceleration limits of conventional stages.

In accordance with an embodiment of the invention, the wafer platter 116 holds a group of target wafers, and the platter 116 is in a rotational or spiral motion during the lithographic projection. Advantageously, a smooth rotary motion may be utilized to avoid the high-speed and acceleration-deceleration issues discussed above. Aspects and features relating to the use of a rotating platter of wafers below in relation to FIGS. 5 through 10.

Further Details on Reflection Electron Beam Lithography Apparatus

Figure 2:
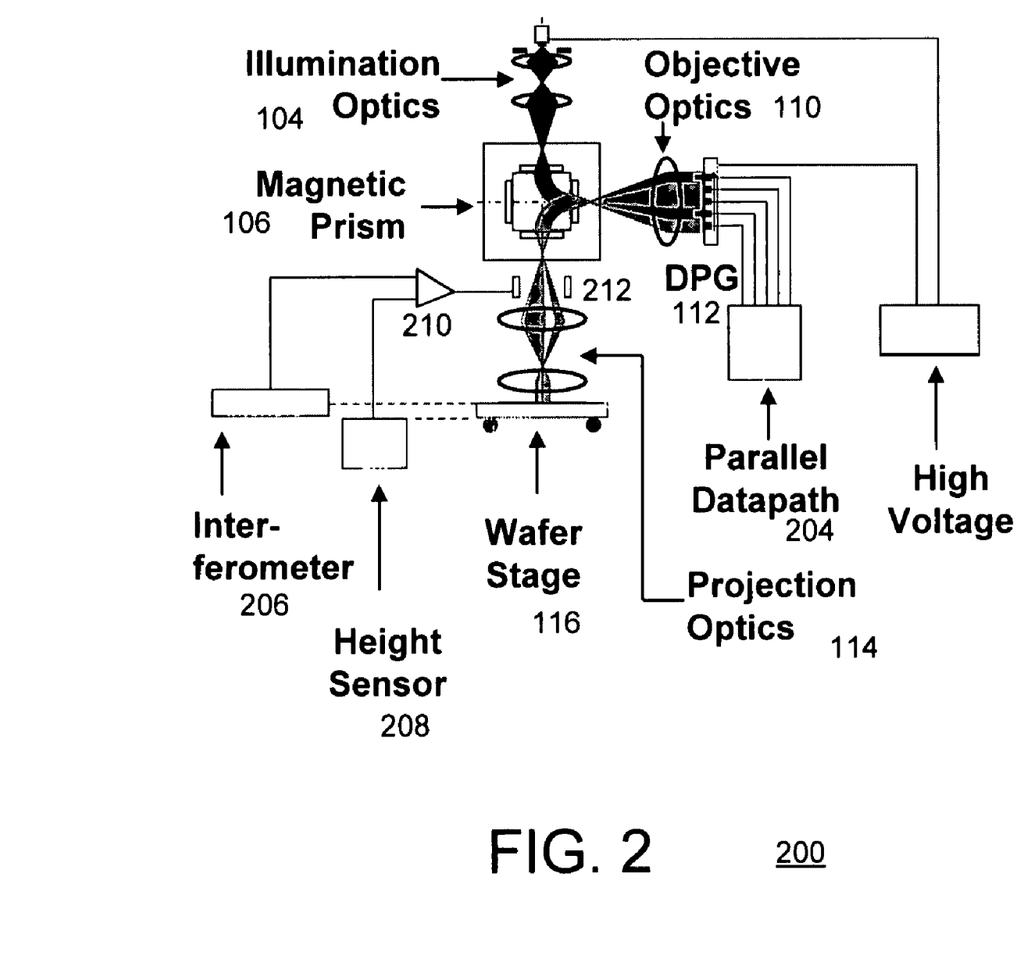
FIG. 2 is a schematic diagram of a maskless reflection electron beam projection lithography apparatus showing further components in accordance with an embodiment of the invention.

FIG. 2 is a schematic diagram of a maskless reflection electron beam projection lithography apparatus 200 showing further components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

In accordance with an embodiment of the invention, the control signals are adjusted so that the pattern moves electronically across the DPG pixel array in a manner that is substantially the same as the way signals move through a shift register. In one implementation of this embodiment, the DPG 112 is configured to resemble a static random access memory (SRAM) circuit, such as that depicted in FIG. 4.

The interferometer 206 may be included to provide tight coupling and positional feedback between the electron beam location and the wafers on the platter. Vertical positional information may be provided by a height sensor 208. The positional information may be fed back via feedback circuitry 210 so as to control beam deflectors 212. The deflectors 212 may be configured to deflect the projected beam so as to compensate for vibrations and positional drift of the wafers.

Figures 3A, 3B:
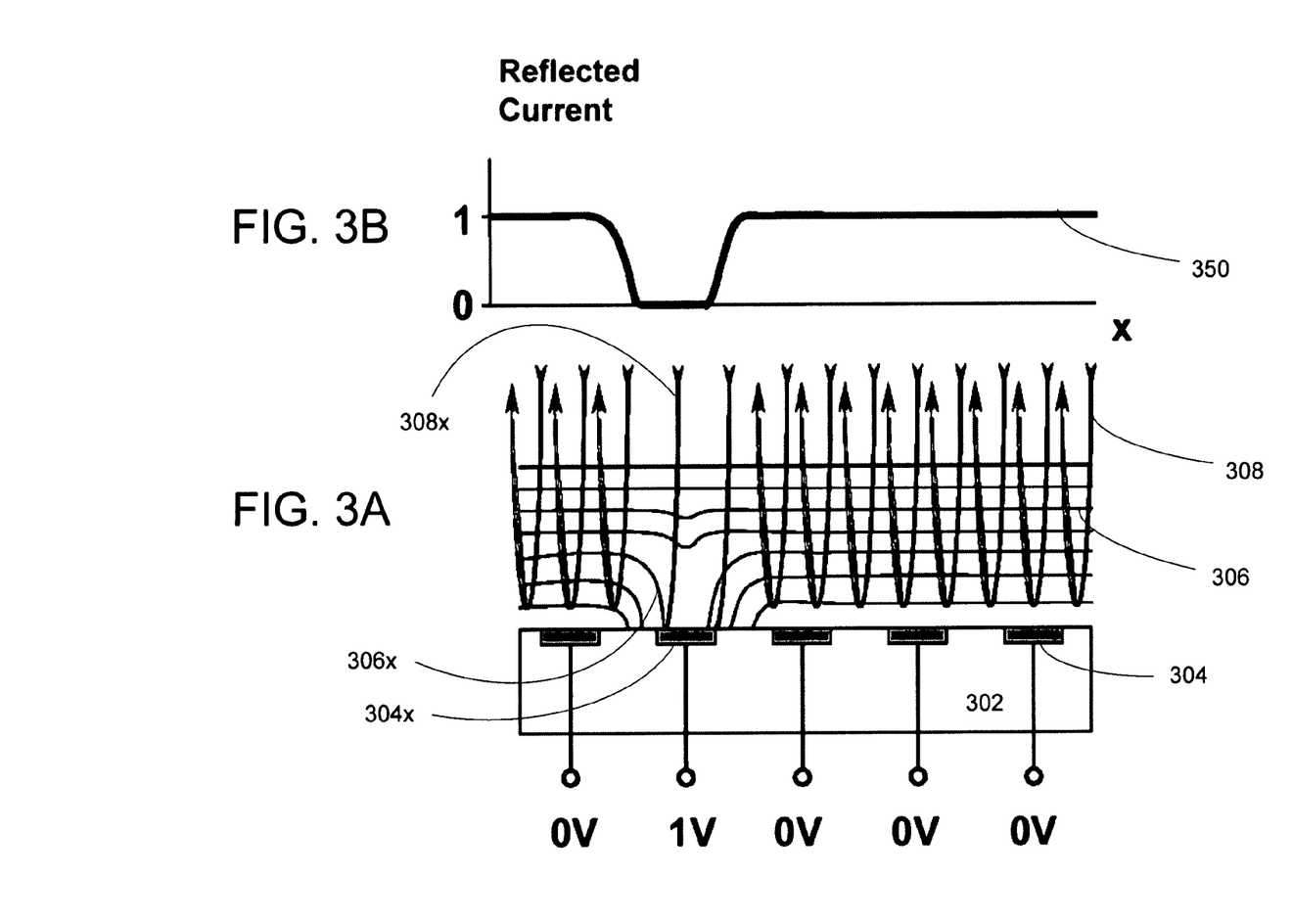
FIGS. 3A and 3B are diagrams illustrating the operation of a dynamic pattern generator in accordance with an embodiment of the invention.

FIGS. 3A and 3B are diagrams illustrating the operation of a dynamic pattern generator in accordance with an embodiment of the invention. FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels are "off" and have zero (0) volts applied thereto, while one pixel (with conductive area labeled 304x) is "on" and has one (1) volt applied thereto. (The specific voltages may vary depending on the parameters of the system.) The resultant local electrostatic equipotential lines 306 are shown, with distortions 306x relating to "off" pixel shown. In this example, the incident electrons 308 approaching the DPG 112 come to a halt in front of and are reflected by each of the "on" pixels, but the incident electrons 308x are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Figure 4:
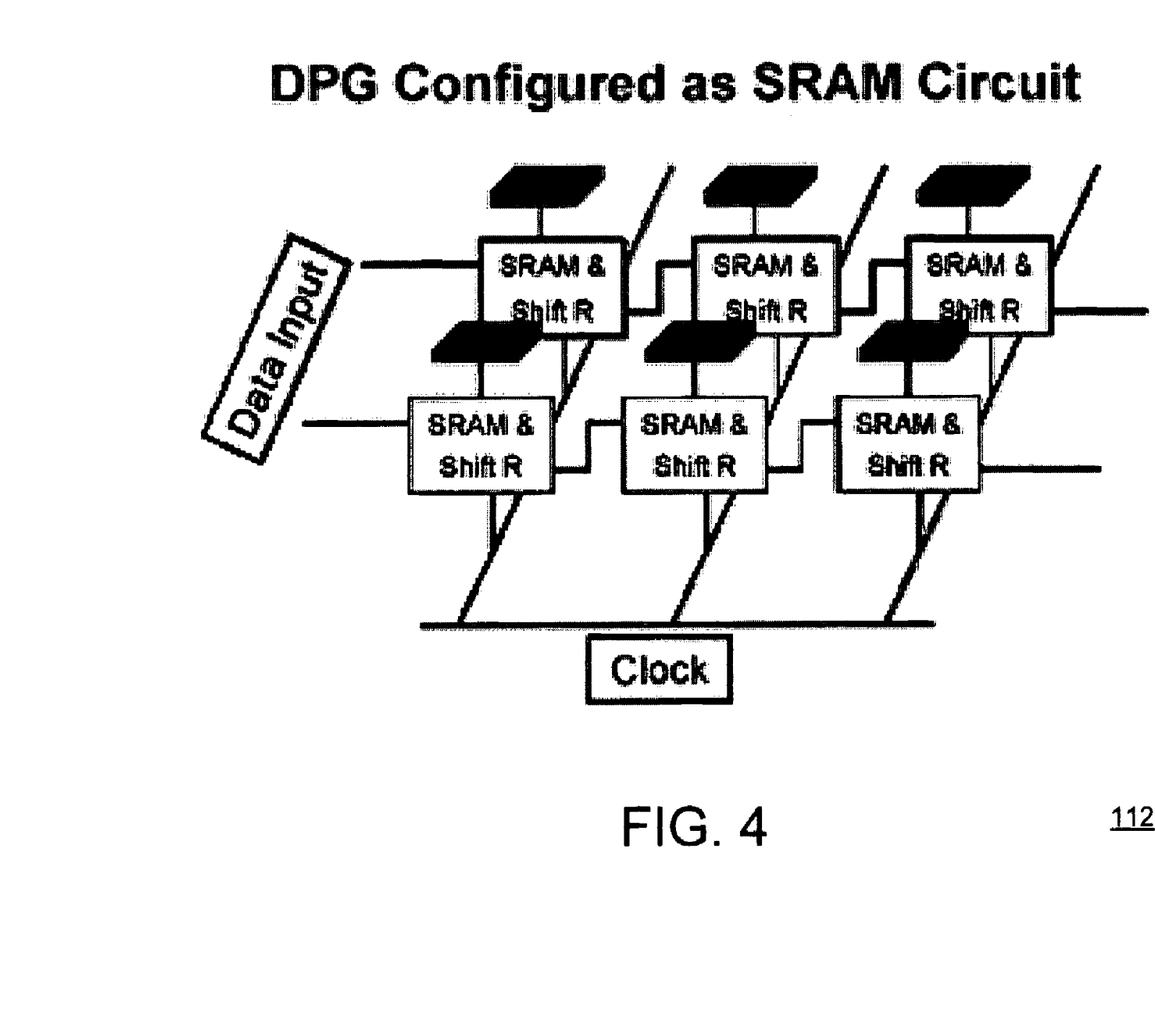
FIG. 4 is a schematic diagram of a dynamic pattern generator implemented in a circuit structure resembling a SRAM in accordance with an embodiment of the invention.

FIG. 4 is a schematic diagram of a dynamic pattern generator 212 implemented in a circuit structure resembling a SRAM in accordance with an embodiment of the invention. To expose a spot on the photoresist on a wafer, each pixel turns "on" (i.e. become reflective) as the spot passes "beneath" the pixel.

Details on Rotatable Platter Solution

Figure 5:
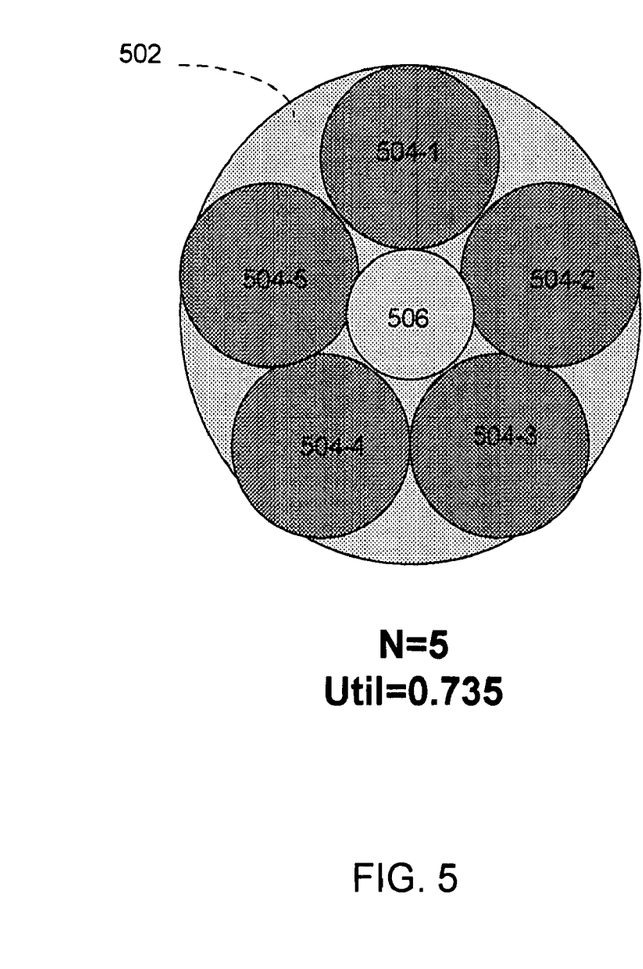
FIG. 5 is a top view diagram showing a rotatable platter configured to hold five wafers in accordance to an embodiment of the invention.

FIG. 5 is a top view diagram showing a rotatable platter 502 configured to hold five wafers in accordance to an embodiment of the invention. As shown, the platter 502 is configured to hold five semiconductor wafers 504-1, 504-2, 504-3, 504-4, and 504-5. A center circular area 506 is shown which is unusable because it is too small for a same-sized wafer. As indicated, this five wafer rotatable platter has a utilization of 0.735 (73.5%). This measure of utilization is defined as being the total area of the wafers divided by the total exposed platter area.

Figure 6:
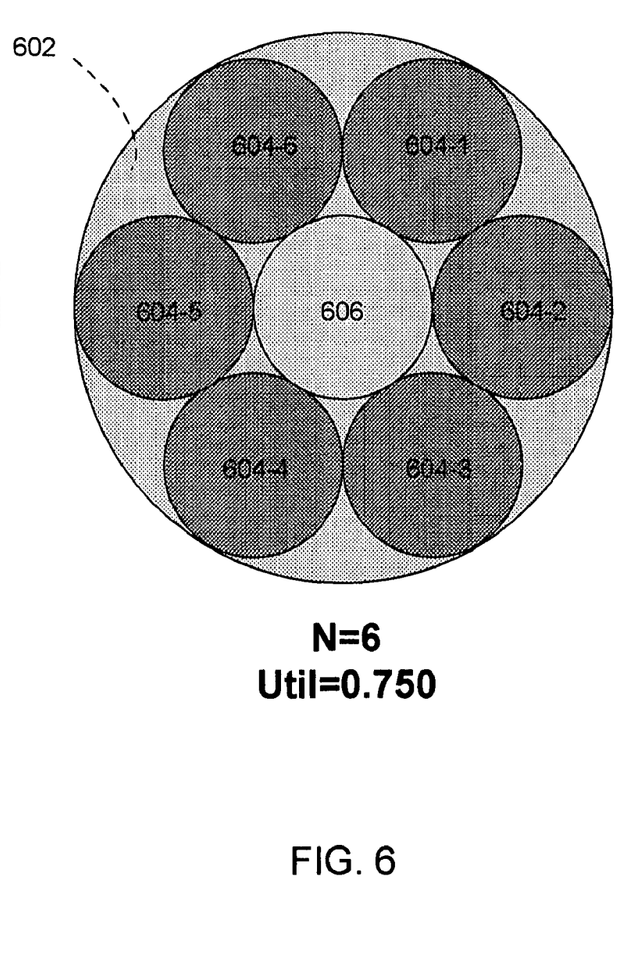
FIG. 6 is a top view diagram of a rotatable platter configured to hold six wafers in accordance to an embodiment of the invention.

FIG. 6 is a top view diagram of a rotatable platter 602 configured to hold six wafers in accordance to an embodiment of the invention. As shown, the platter 602 is configured to hold six semiconductor wafers 604-1, 604-2, 604-3, 604-4, 604-5, and 604-6. A center circular area 606 is shown which may be usable because it is large enough for a same-sized wafer. However, in accordance with an embodiment of the invention, this center circular area 606 is not used to avoid complications relating to the short radii of swath paths needed to cover this center area. As indicated, this six wafer rotatable platter has a utilization of 0.750 (75%).

In accordance with an embodiment of the invention, a rotatable platter may be configured to hold N wafers, where N is two or more. However, N=2 results in a utilization of only 50% with no central circular area, and so is not preferred. Hence, preferable N is at least three. At N=3, the utilization is approximately 65%. In accordance with a specific preferred embodiment, N=8, which results in a utilization of 76.5%.

Figure 7:
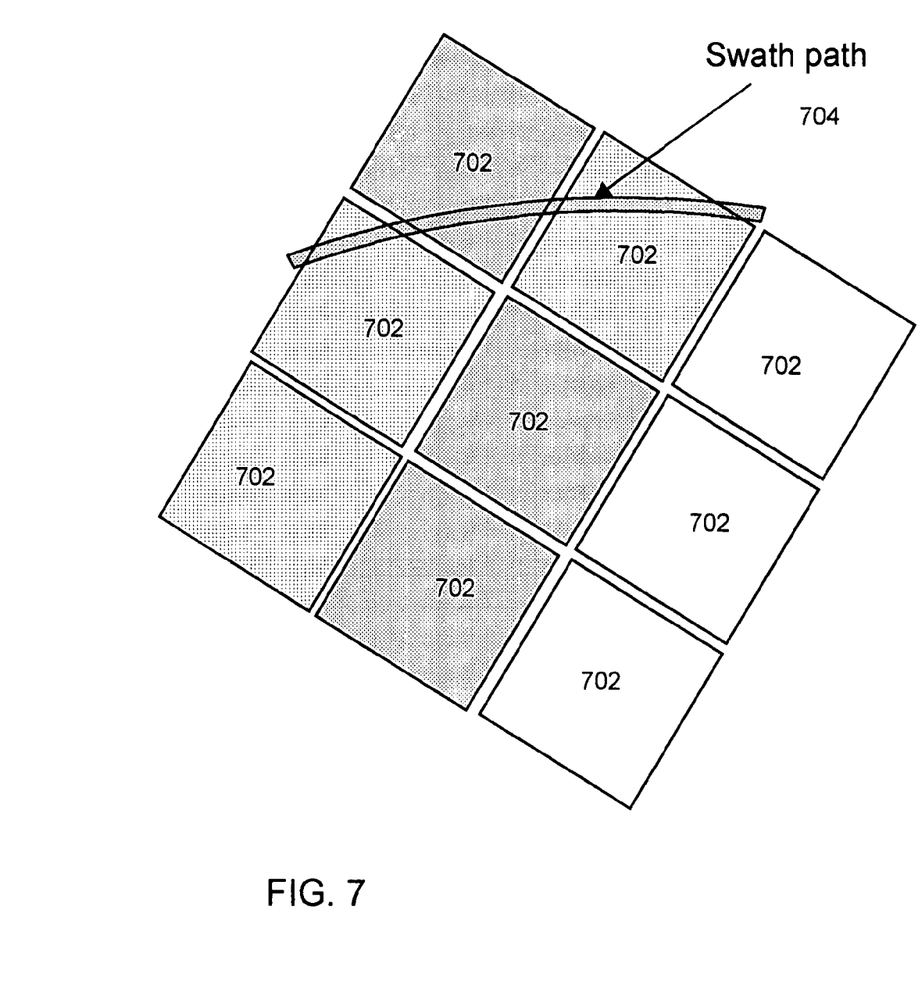
FIG. 7 is a top view diagram showing a swath path arcing across an array of die areas on a semiconductor wafer in accordance with an embodiment of the invention.

FIG. 7 is a top view diagram showing a swath path 704 arcing across an array of die areas 702 on a semiconductor wafer in accordance with an embodiment of the invention. The swath path 704 is the path area covered by the projected beam as the platter rotates. In other words, it is the path area which is patterned during one pass as the wafer rotates under the projected beam.

Figure 8:
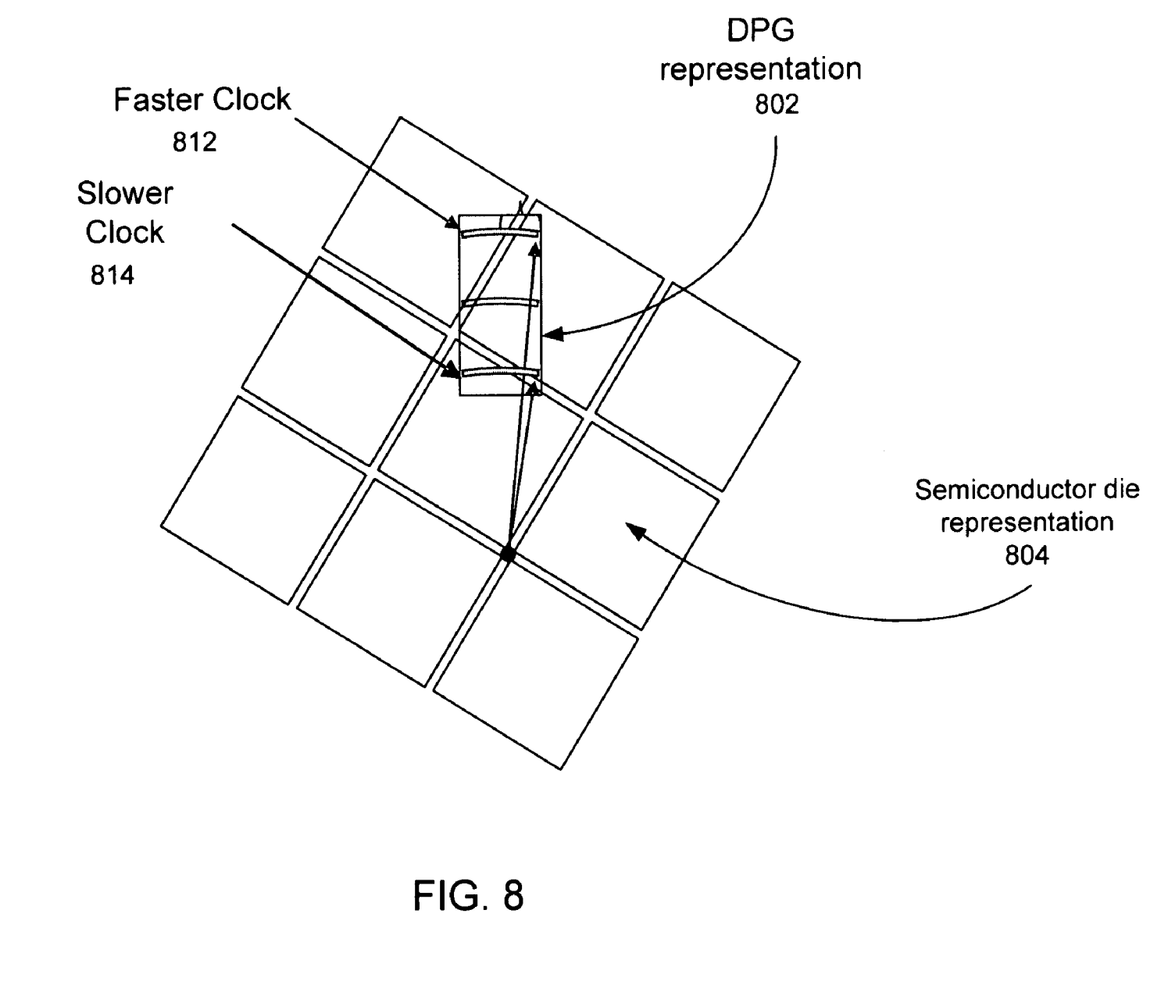
FIG. 8 is a top view diagram with a representation of one full DPG (with pixels in an evenly spaced square grid) overlaid over representations of an array of semiconductor dies illustrating how pixels may need to be translated faster at the outer edge of the DPG than at the inner edge of the DPG in accordance with an embodiment of the invention.

FIG. 8 is a top view diagram with a representation of one full DPG 802 overlaid over representations of an array semiconductor dies 804 illustrating how the pixels may need to be translated faster at the outer (top) edge of the DPG 802 than at the inner (bottom) edge of the DPG 802 in accordance with an embodiment of the invention. Here, the assumption is that the pixels of the DPG 802 are laid out on a grid with square (even) sizing and spacing. The outer edge 812 has the longest radius of the three paths shown, and the inner edge 814 has the shortest radius of the three paths shown.

In accordance with an embodiment of the invention, the speed differential between different radii of rotation may be compensated to a first order by varying the clock speed at which the data is transferred to and presented by different rows of the DPG 802. For example, the clock speed would be adjusted to be faster for the outer path 812 and would be adjusted to be slower for the inner path 814.

Figure 9:
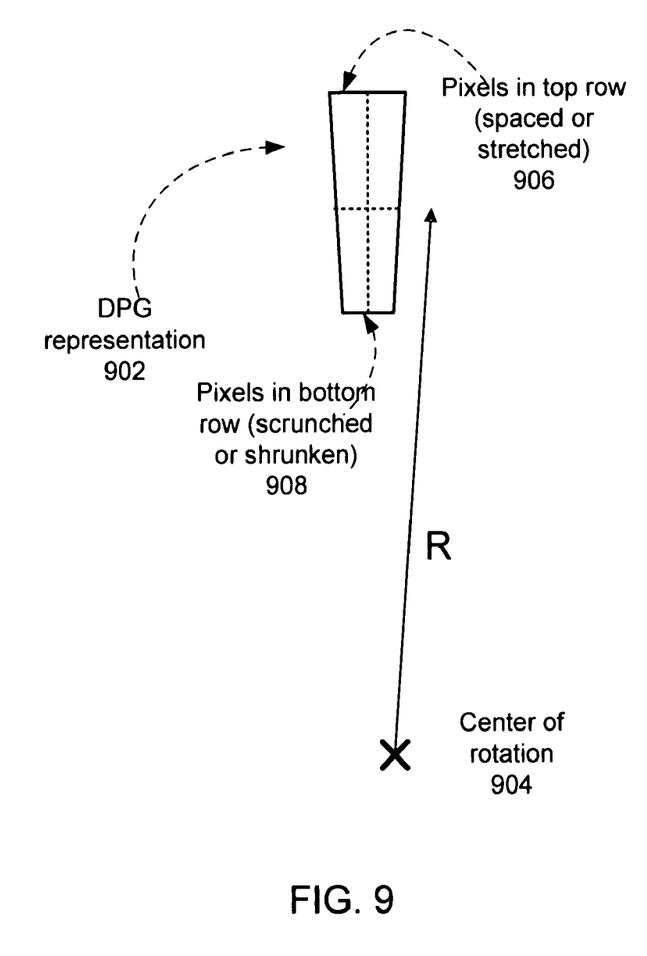
FIG. 9 is a schematic diagram with a representation of a full DPG (with pixels on an unevenly spaced grid) in relation to a center of rotation in accordance with another embodiment of the invention.

FIG. 9 is a schematic diagram with a representation of a full DPG 902 in relation to a center of rotation 904 in accordance with another embodiment of the invention. Here, the assumption is that the pixels of the DPG 802 are laid out on a grid with uneven sizes or spacing. As shown, the top (outer) dimension 906 is longer and the bottom (inner) dimension 908 is shorter. This may be implemented by either spacing or stretching the pixels in rows towards to top dimension 906 of the DPG, and by either scrunching or shrinking the pixels in rows towards the bottom dimension 908 of the DPG.

Figure 10:
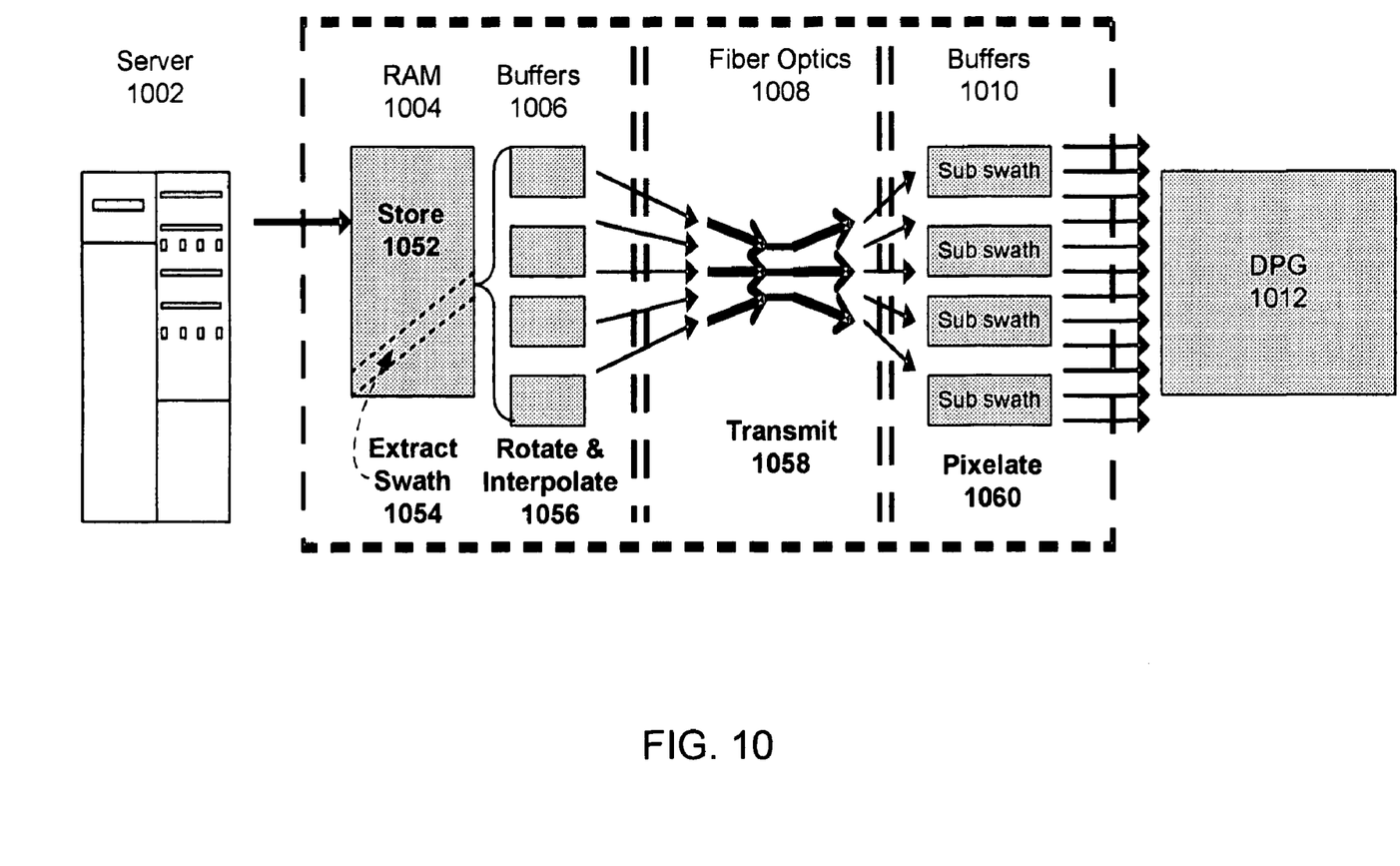
FIG. 10 is a schematic diagram illustrating an example system design to provide data flow to a dynamic pattern generator in accordance with an embodiment of the invention.

FIG. 10 is a schematic diagram illustrating a system design to provide data flow to a dynamic pattern generator in accordance with an embodiment of the invention. The system shown in FIG. 10 is one example system design. Other system implementations may be used in alternative embodiments of the invention.

As shown in FIG. 10, the die data set may be retrieved from a server 1002 and stored 1052 for rapid retrieval in random access memory (RAM) 1004. For example, the die data set may comprise 32 gigabytes of data in cell format.

Thereafter, a swath of data may be extracted 1054 from the data in RAM. The swath of data corresponds to a swath path 704 as discussed above. For example, each swath of data may include approximately one percent or so of the die data set. In that case, if the die data set includes 32 gigabytes of data, then the swath of data may include roughly 320 megabytes of data.

For each swath of data, rotation and interpolation operations 1056 may be performed so as to align the data into a first set of buffers 1006. Each buffer may thus hold a sub-swath of data. For example, if two hundred buffers are used, and if the swath of data includes 320 megabytes of data, then each buffer may hold 1.6 megabytes of data.

In one implementation, the data may be transmitted 1058 via fiber optics 1008 or other high-speed data transmission technology to a pixelator. The pixelator may pixelate 1060 the data by transforming the die data received to pixel data that may be transmitted to and applied by the DPG 1012. In accordance with one embodiment, the pixel data may be stored in a second set of buffers 1010, where each buffer may store pixel data for a sub-swath of data. The pixel data may then be used to feed the DPG 112.

Cellular Data Representation for Sparse Patterns

In accordance with one embodiment of the invention, sparse patterns may be formed using the apparatus and method disclosed in the present application. As mentioned above, sparse patterns may be, for example, an array of contacts where only a small minority of spots (instead of an arbitrarily complex pattern) needs to be written. For example, at most 6%, or more conservatively at most 10% of the wafer's surface area may need to be written with such spots. Such a scenario provides for an opportunity for simplification and increased efficiency.

In particular, instead of storing the data to be written as pixelated data (i.e. as image data), it would be more efficient to store the coordinates of each such spot in a "cell," where the cell typically represents the territory of where one would expect to find one such spot. Hence, there would be sort of a dual set of positional information. The first set of positional information may comprise a coarse representation of a die at a cellular level (for example, represented by a X cell index and a Y cell index), where each cell maps onto a physical spatial part of memory. The second set of positional information may comprise a fine (intra-cell) positional information of a contact that is (for example, represented by a fine X position number and a fine Y position number within a cell). Hence, a global position of a particular contact would then be given by X cell index, X position number, Y cell index, and Y position number.

Advantageously, this "cellular" representation of sparse data patterns enables not only a reduction of the required memory, but it also enables a rapid way to read only the relevant data. This cellular approach may be extended to write somewhat more complex patterns by having two or more writing passes of the DPG over a same area of the wafer, where a second memory for a die is used to store a second set of spot coordinates, a third memory for a die is used to store a third set of spot coordinates, and so on.

CONCLUSION

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for electron beam lithography, the apparatus comprising:
   illumination electron-optics configured to form an illumination electron beam;
   an electron-reflective pattern generator configured to generate an electron-reflective pattern of pixels and to reflect the illumination electron beam from said pattern so as to form a patterned electron beam;
   projection electron-optics configured to project the patterned electron beam;
   a platter configured to hold and rotate a plurality of target substrates; and
   control circuitry configured to shift said pattern of pixels in correspondence with the rotation of the platter so that the patterned electron beam writes a swath path of pixels over the target substrates.

2. The apparatus of claim 1, wherein the platter is further configured to have a center area which is unoccupied by a target substrate.

3. The apparatus of claim 2, wherein the platter is further configured to have a utilization of over sixty-four percent.

4. The apparatus of claim 1, wherein the plurality of target substrates on the platter includes at least three target substrates.

5. The apparatus of claim 4, wherein the plurality of target substrates on the platter includes eight target substrates.

6. The apparatus of claim 1, wherein the control circuitry is further configured to vary a clock speed at which pixel data is transferred to the pattern generator depending on a radius of the swath path, such that a faster clock speed is used for a longer radius, and a slower clock speed is used for a shorter radius.

7. The apparatus of claim 1, wherein pixels on the pattern generator have an expanded outer dimension and a shrunken inner dimension, wherein the outer dimension is projected farther from a center of rotation of the platter, and the inner dimension is projected nearer to the center of rotation of the platter.

8. The apparatus of claim 1, wherein the control circuitry includes random access memory configured to store a die data set.

9. The apparatus of claim 8, wherein the control circuitry is further configured to extract a swath of data from the die data set stored in the random access memory.

10. The apparatus of claim 9, wherein the control circuitry is further configured to apply rotation and interpolation operations on the swath of data.

11. The apparatus of claim 10, wherein the control circuitry further includes a first set of buffers to hold sub-swaths of data after said rotation and interpolation operations.

12. The apparatus of claim 11, wherein the control circuitry is further configured to pixelate the sub-swaths of data to form sub-swaths of pixels, and wherein the control circuitry further includes a second set of buffers to hold the sub-swaths of pixels prior to feeding the sub-swaths of pixels to the pattern generator.

13. A method of reflection lithography, the method comprising:
    forming an illumination beam;
    using a dynamic pattern generating device to generate a reflective pattern of pixels and to reflect the illumination beam from said pattern so as to form a patterned beam;
    projecting the patterned beam onto a platter configured to hold and rotate a plurality of target substrates; and
    shifting said generated pattern of pixels in correspondence with the rotation of the platter so that the patterned beam writes a swath path of pixels over the target substrates.

14. The method of claim 13, wherein the platter is further configured to have a center area which is unoccupied by a target substrate, and wherein a total area of the wafers divided by a total area of the platter which is exposed to the patterned beam is over sixty-four percent.

15. The method of claim 13, wherein the platter is further configured to have a center area which is unoccupied by a target substrate, and wherein the plurality of target substrates on the platter includes at least three target substrates.

16. The method of claim 13, further comprising varying a clock speed at which pixel data is transferred to the dynamic pattern generating device in dependence upon a pixel position in the dynamic pattern generating device, such that a faster clock speed is used for outer pixels, and a slower clock speed is used for inner pixels.

17. The method of claim 13, wherein pixels are spaced on an uneven grid on the dynamic pattern generating device so as to have an expanded outer row and a shrunken inner row, wherein the outer row is farther from a center of rotation of the platter, and the inner row is nearer to the center of rotation of the platter.

18. The method of claim 13, wherein the illumination beam and the patterned beam both comprise electron beams.

19. An apparatus for direct write electron beam lithography, the apparatus comprising:
- means for forming an illumination electron beam;
- a dynamic pattern generating device to generate an electron-reflective pattern of pixels and to reflect the illumination electron beam from said pattern so as to form a patterned electron beam;
- means for projecting the patterned electron beam onto a platter configured to hold and rotate a plurality of target substrates; and
- means for shifting said generated pattern of pixels in correspondence with the rotation of the platter so that the patterned electron beam writes a swath path of pixels over the target substrates.

20. The apparatus of claim 19, wherein the platter is further configured to have a center area which is unoccupied by a target substrate, and wherein a total area of the wafers divided by a total area of the platter which is exposed to the electron beam is over sixty-four percent.

21. The apparatus of claim 19, further comprising circuitry configured to vary a clock speed at which pixel data is transferred to the dynamic pattern generating device in dependence upon a pixel position in the dynamic pattern generating device, such that a faster clock speed is used for outer pixels, and a slower clock speed is used for inner pixels.

22. The apparatus of claim 19, wherein pixels are spaced on an even grid on the dynamic pattern generating device so as to have an expanded outer row and a shrunken inner row, wherein the outer row is farther from a center of rotation of the platter, and the inner row is nearer to the center of rotation of the platter.

23. A method of direct write lithography, the method comprising:
- forming a patterned beam which is dynamically changed over time;
- projecting the patterned beam onto a platter configured to hold and rotate a plurality of target substrates; and
- shifting said generated pattern of pixels in correspondence with the rotation of the platter so that the patterned beam writes a swath path of pixels over the target substrates.

24. The method of claim 23, further comprising varying a clock speed at which pixel data is transferred in dependence upon a pixel position in a dynamic pattern generating device, such that a faster clock speed is used for outer pixels, and a slower clock speed is used for inner pixels.

25. The method of claim 23, wherein pixels are spaced on an uneven grid on a dynamic pattern generating device so as to have an expanded outer row and a shrunken inner row, wherein the outer row is farther from a center of rotation of the platter, and the inner row is nearer to the center of rotation of the platter.

26. The method of claim 23, using a cellular representation of a lithographic pattern to be projected.

27. The method of claim 26, wherein the lithographic pattern has an area coverage of less than 10% of an area of a target substrate.

28. The method of claim 26, wherein the cellular representation uses cell indices and intra-cell positional coordinates to represent a spot to be written.

\* \* \* \* \*